US006304205B1

(12) United States Patent
Rezvani et al.

(10) Patent No.: US 6,304,205 B1
(45) Date of Patent: Oct. 16, 2001

(54) A/D MULTI-CHANNEL PIPELINE ARCHITECTURE

(75) Inventors: Behrooz Rezvani, San Ramon; Peter Gunadisastra, Palo Alto, both of CA (US)

(73) Assignee: Ikanos Communications, Inc., Fremont, CA (US)

( * ) Notice: Subject to any disclaimer, the term of this patent is extended or adjusted under 35 U.S.C. 154(b) by 0 days.

(21) Appl. No.: 09/602,639

(22) Filed: Jun. 22, 2000

Related U.S. Application Data (60) Provisional application No. 60/166,069, filed on Nov. 17, 1999, and provisional application No. 60/168,465, filed on Dec. 1, 1999.

(51) Int. Cl.$^7$ ....................................... H03M 4/44
(52) U.S. Cl. .................... 341/161; 341/136; 341/156; 341/162; 341/158; 341/118; 341/120; 341/110; 341/155; 341/163
(58) Field of Search ................................. 341/161, 156, 341/136, 162, 158, 110, 118, 120, 155

(56) References Cited

U.S. PATENT DOCUMENTS

| | | | |
|---|---|---|---|
| 5,635,937 | * | 6/1997 | Lim et al. ............................. 341/161 |
| 5,710,563 | * | 1/1998 | Vu et al. ............................... 341/161 |
| 5,764,176 | * | 6/1998 | Ginetti ................................. 341/161 |

\* cited by examiner

*Primary Examiner*—Michael Tokar
*Assistant Examiner*—Lam T. Mai
(74) *Attorney, Agent, or Firm*—Cary & Kelly, LLP; Charles C. Cary (57) ABSTRACT

An apparatus and method for A/D conversion is provided. The apparatus provides for multi-path multi-channel (MPMC) pipelined A/D conversion. Unlike prior art designs in which the handling of multiple channels requires a linear increase in the associated circuitry and components, the current design scales for multiple channel A/D conversion with less than linear scalability. The A/D converter comprises a plurality of stages and interfaces between adjacent columns of the stages. The stages each include an input, a first output, and a second output. Each of the stages is responsive to an input signal applied to the input to output at the first output a bit signal corresponding to at least one significant bit of the input signal and to output at the second output a residue signal corresponding to a difference between the input signal and the bit signal. The stages are arranged in columns. The interfaces are located between adjacent columns for passing residue signals from an upstream one of the adjacent columns to the inputs of a downstream one of the adjacent columns. At least one interface includes a multiplexer. The multiplexer switchably couples residue signals from at east two of the plurality of stages within the upstream one of the adjacent columns across one of the plurality of stages within the downstream one of the adjacent columns.

16 Claims, 10 Drawing Sheets

PRIOR ART

A/D MULTI-CHANNEL PIPELINE ARCHITECTURE

CROSS REFERENCE TO RELATED APPLICATION

This application claims the benefit of prior filed co-pending Provisional Application No. 60/166,069 filed on Nov. 17, 1999 and co-pending Provisional Application No. 60/168,465 filed on Dec. 1, 1999. Each of the above-cited applications is incorporated herein by reference in its entirety.

BACKGROUND OF THE INVENTION

1. Field of Invention

The field of the present invention relates in general to analog-to-digital (A/D) conversion. More particularly the present invention relates to a multi-stage pipelined A/D converter.

2. Description of the Related Art

Analog-to-digital (A/D) converters are used in a wide variety of applications including telecommunications, radar, medical imaging, seismology, etc. There are numerous architectures for implementing A/D conversion including: flash, multi-step, pipeline, interplating, and time-interleaved successive approximation. The pipelined technique offers minimal circuit complexity, silicon area and power consumption with relatively high throughput.

In a pipelined architecture, the first stage operates on the most recent sample inputted while subsequent stages operate on residues from the prior samples output from prior stages of the cascaded pipeline architecture.

Figure 1A:
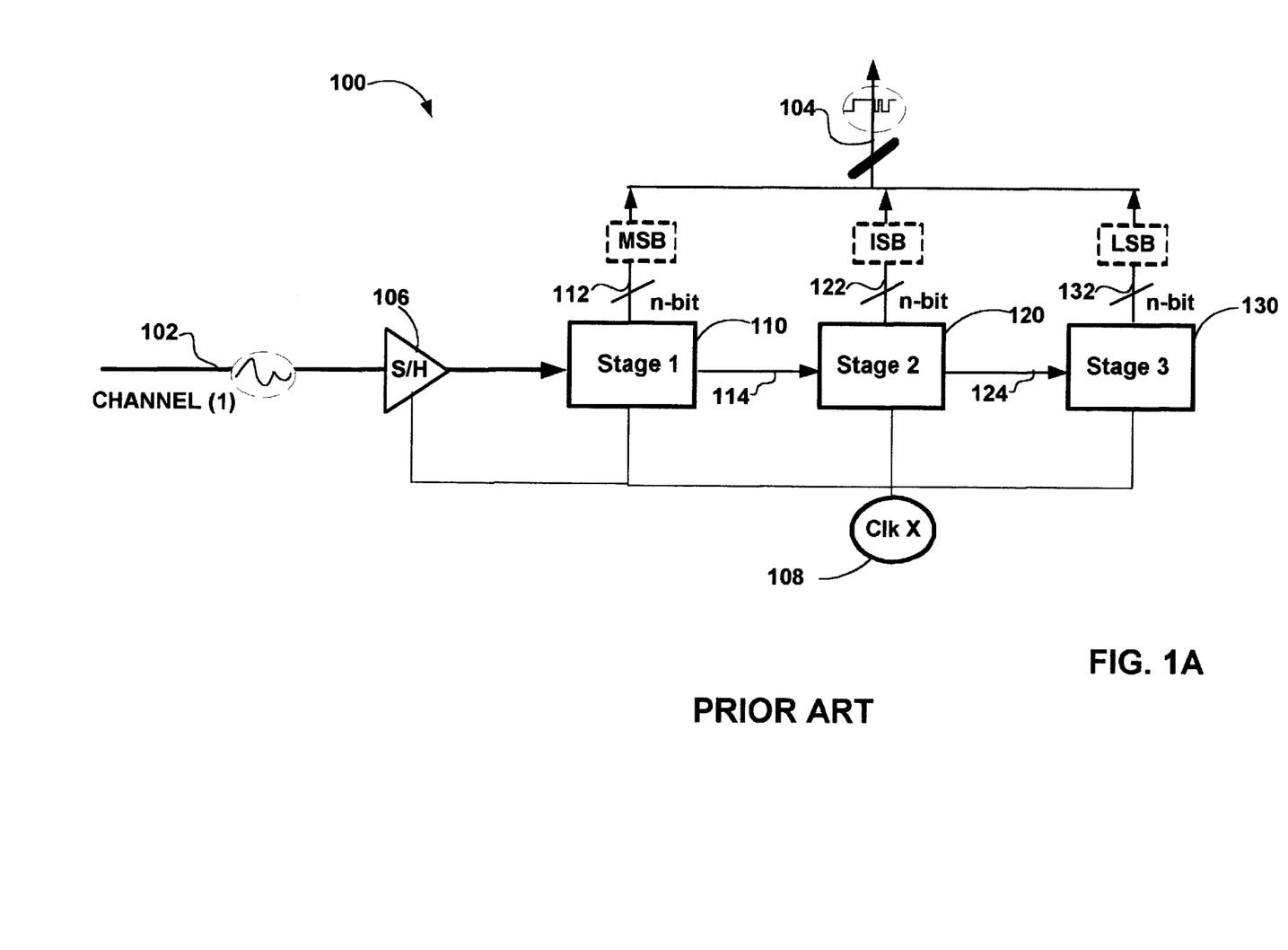
FIGS. 1A–B show a prior art implementation of a single-path multi-stage analog-to-digital (A/D) converter.

FIG. 1A is a block diagram of a prior art pipelined A/D converter with three stages 110, 120, 130. The converter includes a sample and hold unit 106; first, second, and third stages respectively 110, 120, 130; and a common clock 108. Each stage makes a digital approximation of the amplitude of the analog sample presented to it and passes the amplified residue to the next stage where the process is repeated for the next most significant bits. In operation, an analog signal (e.g., channel 1) on line 102 is delivered to a first sample and hold element 106. The first stage makes the digital approximation of the most significant bits of the sampled signal and delivers that on bit line 112. The amplified residue is presented on signal line 114 to the intermediate stage 120. The intermediate stage generates a digital approximation of the most significant bits of the residue signal, which in this case corresponds to the intermediate significant bits of the sample obtained from channel 1. These intermediate significant bits are output on bit line 122 and the amplified residue is output on signal line 124. Signal line 124 provides the input to the final stage 130 which generates a digital signal corresponding to the most significant bits of the residue. These bits correspond with the least significant bits of the original sample of channel 1. These are output on bit line 132. The composite signal in serial or parallel form with a precision determined by the combined signals on bit lines 112, 122, and 132 is presented on digital signal line 104. The common clock 108 drives each of the above-discussed components in a synchronous relationship. Each operates at the same clock speed.

Figure 1B:
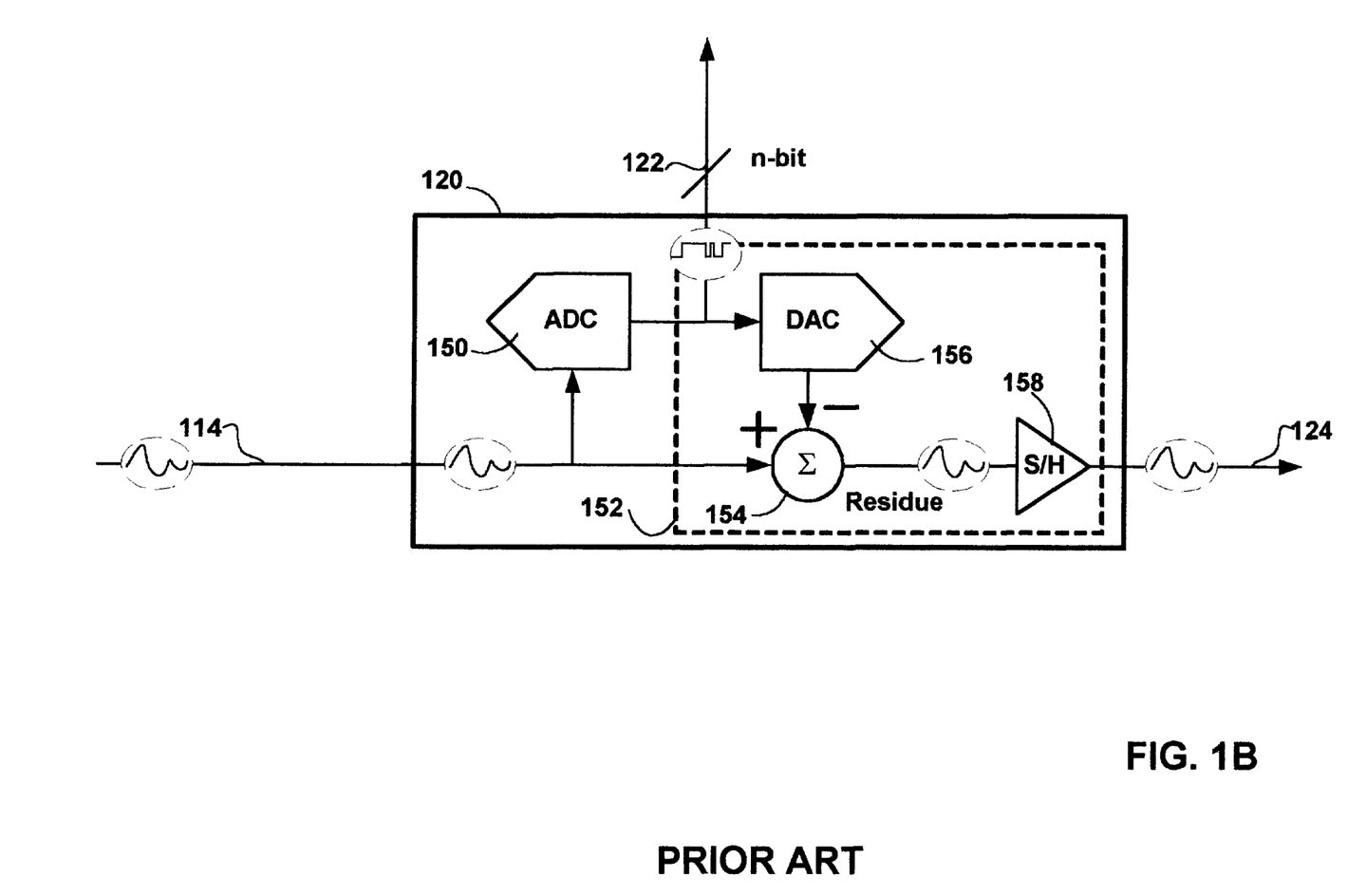

As shown in FIG. 1B, each stage contains a sample and hold (SH) 158, an A/D converter (ADC) 150, a digital-to-analog converter (DAC) 156, and a differencer 154. The functions implemented by the DAC, SH and differencer may be implemented by a multiplying digital-to-analog converter (MDAC) 152. Both the ADC 150 and the differencer 154 are coupled directly to the analog signal line 114. The ADC 150 generates a signal corresponding the most significant bits of the signal received on signal line 114. This signal is provided as an output on bit line 122 as well as an input to the DAC 156. The DAC converts these most significant bits to analog form and provides them to the negative input of differencer 154. The differencer outputs a residue signal corresponding to the difference between the input signal on line 114 and the most significant bits generated by ADC 150 on bit line 122. The output of the summer is identified as a residue which is passed to the SH device 158 for output on signal line 124. The SH device includes a gain element to amplify the residue.

The main advantage of pipelined ADCs are that they can provide high throughput rates and occupy small die areas. Both advantages stem from the concurrent operation of the stages; that is, at any time the first stage operates on the most recent sample, while all other stages operate on residues from previous samples. (The associated latency is not a limitation in many applications.) If the A/D are done with flash converters, pipelined architectures require only two main clock phases per conversion; therefore the maximum throughput rate can be high. Also, since the stages operate concurrently, the number of stages used to obtain a given resolution is not constrained by the required throughput rate. For multichannel applications, prior art pipelined A/D converters require proportionately larger die areas and have concurrently larger power dissipations.

What is needed is a A/D converter architecture with reduced die area and power dissipation for multichannel applications.

SUMMARY OF THE INVENTION

An apparatus and method for A/D conversion is provided. The apparatus provides for multi-path multi-channel (MPMC) pipelined A/D conversion. Unlike prior art designs in which the handling of multiple channels requires a linear increase in the associated circuitry and components, the current design scales for multiple channel A/D conversion with a less than linear increase in the number of components. This reduces the overall silicon area and power consumption of the apparatus as compared with prior art designs.

In an embodiment of the invention an A/D converter for obtaining digital samples from a plurality of analog information signals is disclosed. The A/D converter comprises a plurality of stages and interfaces between adjacent columns of the stages. The stages each include an input, a first output, and a second output. Each of the stages is responsive to an input signal applied to the input to output at the first output a bit signal corresponding to at least one significant bit of the input signal and to output at the second output a residue signal corresponding to a difference between the input signal and the bit signal. The stages are arranged in columns. The interfaces are located between adjacent columns for passing residue signals from an upstream one of the adjacent columns to the inputs of a downstream one of the adjacent columns. At least one interface includes a multiplexer. The multiplexer switchably couples residue signals from at least two of the puality of stages within the upstream one of the adjacent columns across one of the plurality of stages within the downstream one of the adjacent columns.

In an another embodiment of the invention, the A/D converter includes stages arranged as an upstream and a downstream column and a multiplexer. Each of the stages includes an input, a first output and a second output, and are responsive to an input signal applied to the input to output at the first output a bit signal corresponding to at least one significant bit of the input signal and to output at the second output a residue signal corresponding to a difference between the input signal and the bit signal. The multiplexer switchably couples residue signals from at least two of the stages within the upstream column across one of the stages within the downstream column.

In another embodiment of the invention, a method for obtaining digital samples from a plurality of analog information signals is disclosed. The method for converting comprises the acts of:

obtaining during a first time interval;
  a) a first magnitude of a first of the plurality of analog information signals and a second magnitude of a second of the plurality of analog information signals; and
  b) differencing the first magnitude with the first of the plurality of analog information signals to generate a first residue, and differencing the second magnitude with the second of the plurality of analog information signals to generate a second residue; and obtaining during a second time interval beneath a selected threshold no greater than ½ the first time interval:
  c) the magnitude of the first residue and the magnitude of the second residue; and combining the first magnitude with the magnitude of the first residue to extend a precision of the first magnitude and combining the second magnitude with the magnitude of the second residue to extend the precision of the second magnitude.

In another embodiment of the invention, the method for converting comprises the acts of:

obtaining during a first time interval for signals corresponding with each of the analog information signals both a first magnitude, and a first residue and the residue obtained by differencing each of the first magnitudes with a corresponding one of the analog information signals;

obtaining during a second time interval beneath a selected threshold no greater than ½ the first time interval both a second magnitude and a second residue for each of the first residues, and the second residues obtained by differencing each of the second magnitudes with a corresponding one of the first residues; and combining each of the first magnitudes together with a corresponding one of the second magnitudes to extend a precision of each of the first magnitudes.

BRIEF DESCRIPTION OF THE DRAWINGS

These and other features and advantages of the present invention will become more apparent to those skilled in the art from the following detailed description in conjunction with the appended drawings in which:

FIGS. 5A–B are timing diagrams for the three stage MPMC A/D converter showing two distinctive multi-path configurations. DETAILED DESCRIPTION OF THE EMBODIMENTS An apparatus and method for analog-to-digital (A/D) conversion is provided. The apparatus provides for multi-path multi-channel (MPMC) pipelined A/D conversion. Unlike prior art designs in which the handling of multiple channels requires a linear increase in the associated circuitry and components, the current design scales for multiple channel A/D conversion with less than linear scalability. Using prior art designs, a total of 12 discrete stages would be required to implement a 4×3×4 A/D converter, i.e., 4 channels each pipelined through 3 dedicated columns of 4 stages each. Using the apparatus of the current invention, the A/D conversion of the 4 channels would require substantially fewer stages. For example, in one embodiment of the current invention, a total of 7 stages would suffice, with 4 in the first column, 2 in the second column and 1 in the third column. Other architectures are possible. This architecture results in part from running each of the downstream stages on a faster clock than their upstream counterparts. A stage which is part of a column is said to be downstream from another upstream column of stages when an input to the downstream stages includes the residue output of the upstream column/stages. When the increase in clock speed of a downstream stage exceeds twice that of its upstream counterpart, multiplexing of two or more residues across a single downstream stage is possible. In an alternate embodiment of the invention, only selected pairs of adjacent columns would be designed with an asymmetric number of stages, with other adjacent pairs having perhaps an equal number of stages.

Figure 2A:
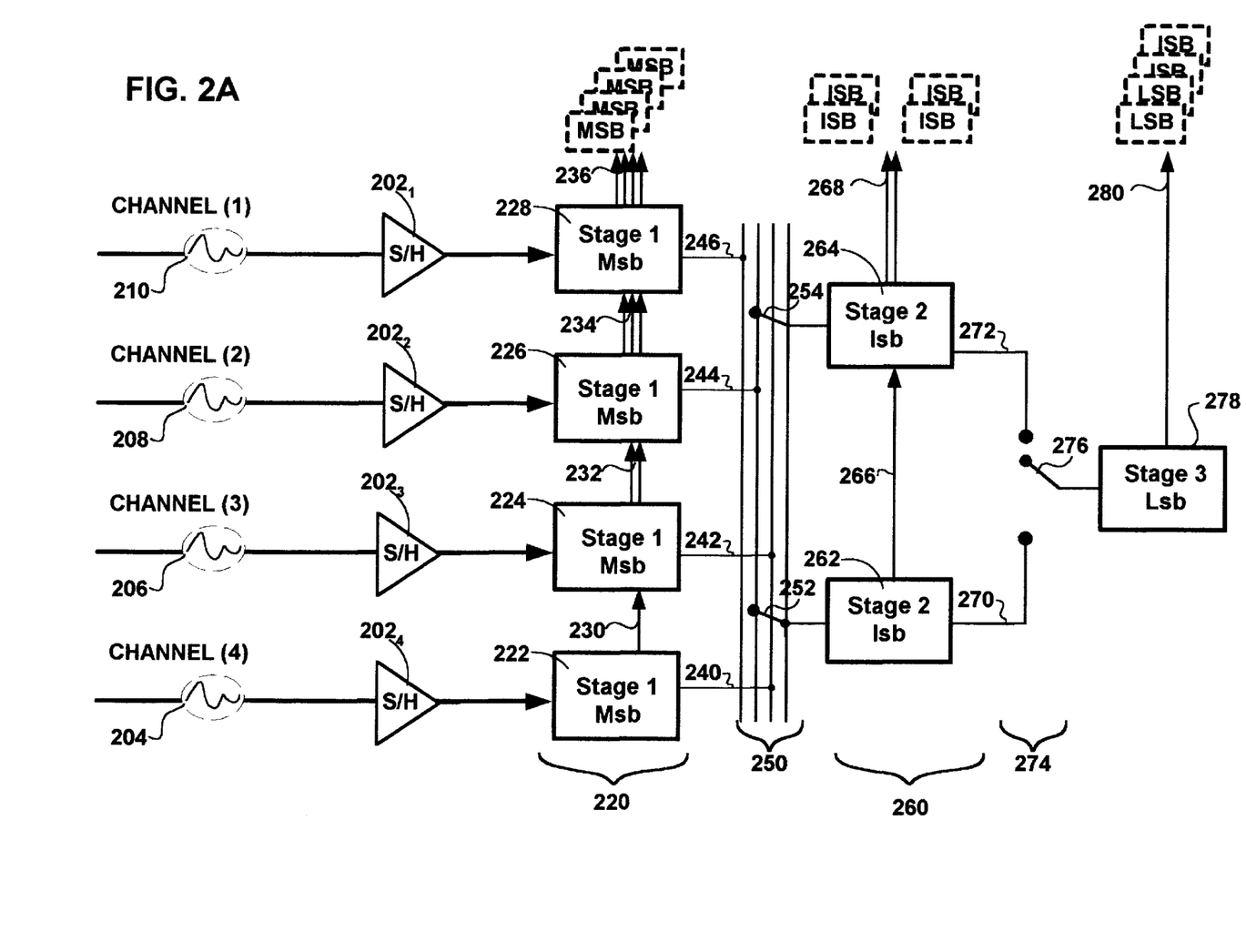
FIGS. 2A–B are hardware block diagrams of alternate embodiments of a multi-path multi-channel (WPMC) A/D converter in accordance with the current invention.
Figure 2B:
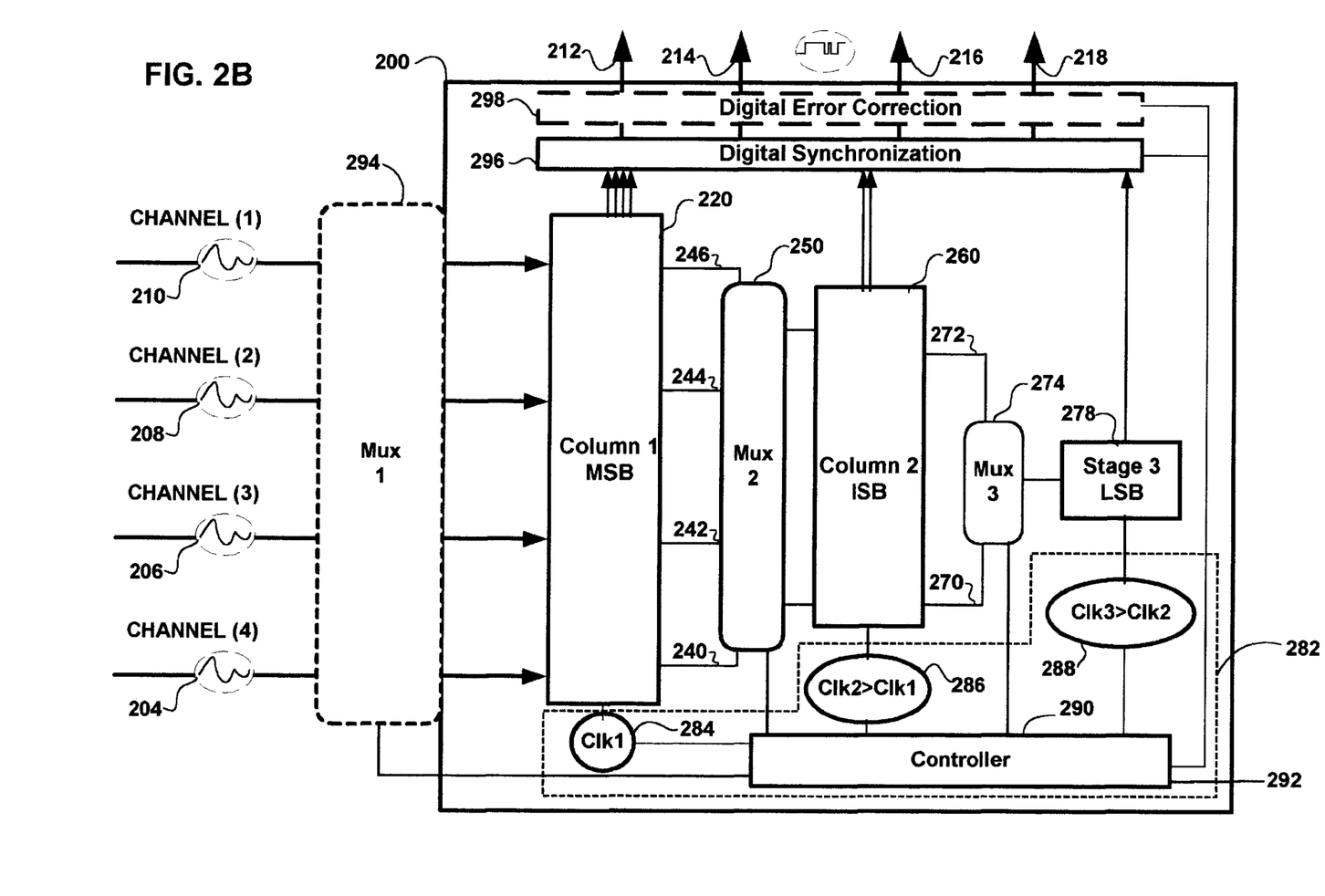

FIGS. 2A–B show alternate embodiments of a MPMC A/D converter. Both are designed with decreasing numbers of stages within successive columns, though this need not be the case. As discussed above, alternate embodiments of the invention may not employ this continuous asymmetry, relying instead on asymmetry in the number of stages between only one upstream and downstream column to achieve a reduction in overall form factor, power consumption and silicon area as compared with prior art designs.

The designs in both FIGS. 2A–B are compact and have a reduced form factor when compared with prior art designs. This reduced form factor is brought about by the fact that successive stages of A/D conversion are performed by A/D stages arranged in columns where at least one of the downstream columns includes a decreased number of individual A/D stages, as compared with the adjacent upstream column. This reduction in the number of stages in the downstream one of a pair of columns reflects the fact that the individual A/D stages within the downstream column are running on faster clocks than their upstream counterparts. Where the clock driving the downstream column of stages runs at twice or more the rate of the clock driving the stages of the upstream column, a single downstream stage can process the residue from at least two upstream stages without introducing a bottleneck in the overall conversion throughput. In other words, by where an upstream and downstream column have an asymmetric number of stages, the bandwidth of each column remains equal to that of the other, provided the clock rate of the column with fewer stages is increased by an appropriate amount. Neither performance nor precision is sacrificed by this arrangement. This results from the fact that the amplification of the residue for each channel by each column allows the successor column to process that residue at a higher bandwidth/clock speed and lower gain without sacrifice of either precision or accuracy. Thus the MPMC A/D converters of the current invention require substantially fewer individual stages per channel in a multi-channel environment than would be the case for prior art designs which require dedicated stages for each channel.

FIG. 2A shows an embodiment of the MPMC A/D conversion unit with three columns 220, 260 and 278 generating, respectively, the most significant bit, intermediate significant bits, and least significant bits of four discrete input channels 1–4. The design includes three columns 220, 260, 278 of stages. The first column 220 includes four stages 222–228. The second column 260 includes two stages 262–264. The third column includes a single stage 278. The clock frequency of each stage within the second column 260 is twice that of the stages of the first column 220. The clock frequency of the third stage 278 is twice that of each of the stages of the second column 260 and four times that of each of the stages of the first column 220. Thus, in the time interval required for any of the stages of column 1 to obtain a digital estimate of the most significant bits of any corresponding channel, the single final stage 278 generates four digital samples for the residues derived from each of the four channels. Each channel may be characterized as an analog information signal. In an alternate embodiment of the invention each input, e.g. input 210, may be characterized as an analog information signal corresponding to more than one channel, with the multiple channels within a single analog information signal multiplexed in any of a number of protocols well known to those skilled in the art, e.g. time division multiple access, frequency division multiple access etc.

FIG. 2A shows an embodiment of the invention in which multiplexers, in the form of crossbar switches, flexibly connect individual stages of one column to those of a successor column. The switches allow time division multiplexing (TDM) of two or more residues obtained from a predecessor column onto a single stage of an adjacent column. In the specific embodiment shown in FIG. 2A, channel 1 is provided on line 210 as an input to the sample and hold device $202_1$, the output of which is coupled to the input of the A/D stage 228. Stage 228 generates the most significant bit(s) of channel 1 on line 236 with the amplified residue provided on line 246. Channel 2 is provided on line 208 as an input to sample and hold device $202_2$, the output of which is coupled to the input of A/D stage 226. A/D stage 226 provides, during the sample interval, the most significant bit(s) of channel 2 on signal line 234 and the amplified residue on signal line 244. Channel 3 is provided on line 206 as an input to sample and hold device $202_3$, the output of which is coupled to the input of the A/D stage 224. The most significant bit(s) of channel 3 are provided as an output on signal line 232 with the amplified residue provided on line 242. Channel 4 is provided on line 204 as an input to sample and hold device $202_4$, the output of which provides an input to A/D stage 222. During a sample interval, that stage generates on signal line 230 the most significant bit(s) of channel 4 with the amplified residue provided on line 240. Each of residue lines 240–246 are coupled to an individual trace of a crossbar switching arrangement which serves as a multiplexer 250 joining the first column 220 to the individual stages of the second column 260. Under control of a switch controller (See FIG. 2B) each of the stages 262–264 of column 260 are sequentially and periodically coupled to one or more of the four traces to provide input to the second column's stages of the residues from the first column. Where the channels 1–4 all have the same bandwidth, i.e., baud rate, each switch would multiplex two residues from column 1 across two inputs to column 2. Each stage in column two would be required to generate twice the number of digital approximations in a given unit of time, as is the case with their counterparts in column 220. The stages within the second column process the residues from the first column. A/D stage 262 accepts a switched input from switch 252 and delivers intermediate significant bit(s) of the overall sample on line 266 with the residue provided on line 270. Similarly, A/D stage 264 accepts a switched input from switch 254 and delivers intermediate significant bit(s) of the overall sample on line 266 with the residue provided on line 270. The most significant bits of the residues from the first column correspond, in this case, to the intermediate significant bits of the overall signal sample for each of the channels. These intermediate significant bits are provided, as discussed above, as output on signal lines 266–268 with the amplified residue provided on signal lines 270–272.

The multiplexer 274 couples each of residue lines 270–272 to the third and, in this case, final column/stage 278. Stage 278 accepts a switch input from switch 276 and provides the significant bits of that residue, corresponding in this architecture, to the least significant bit(s) of the overall sample on signal line 280. In the sample 0 interval in which any one of the stages in the first column generates a single digital sample, the third and final stage 278 generates 4 least significant digital bit(s) samples derived from the residues of each of the input channels 1–4.

Although the architecture described and discussed above in connection with FIG. 2A exhibits a binary relationship between columns, each column having a successor column having half the number of A/D stages as its predecessor column, such need not be the case. Any number of ratios are in keeping with the teachings of the current invention, provided only that at least two adjacent columns include an asymmetric number of stages and are coupled to one another in an arrangement that provides for multiplexing multiple residues from an upstream stage/column across at least one A/D stage of the downstream one of the pair of columns.

The number of bits generated by each column is not fixed in relation to the other columns or in an absolute sense. Each column may generate one or more bits, the number of bits generated by each column may match or not match the number generated by any other columns. This is left to the discretion of the designer.

Additionally, although the number of columns in the examples shown is three, this number is not fixed. There could be from 2-N stages without departing from the scope of the claimed invention. Some of the columns may be coupled by the above discussed multiplexed and pipelined architecture, while others are coupled in a fixed pipelined relationship.

Although each of the input lines 204–210 has been indicated to supply a single channel of input, such need not be the case. Instead, it is entirely within the scope of the claimed invention for each input to carry sets of multiplexed channels with the subsequent A/D conversion carried out in multiplexed fashion for each set of channels.

The one-to-one coupling between the input channels and the corresponding stage in the first column is not required. Instead, as is shown in FIG. 2B, it may be practical to insert a multiplexer between the signal lines 204–210 of each of the input channels and the first column 220. This may be required where the first column contains fewer stages in number than the number of separate input channels.

In FIG. 2B, each of channels 1–4 is provided on the corresponding one of input lines 210, 208, 206, 204 to multiplexer 294. The output of the multiplexer is coupled to the inputs of the individual stages of the first column 220. Each stage within the first column operates on a clock 284. Clock 284 operates at a frequency less than half that of clock 286, which is coupled to the second column 260 of stages 262–264. Clock 286, in turn, operates at a frequency less than half that of clock 288, which is coupled to the final stage/column 278. Thus, in this embodiment, the third stage is clocked at a frequency 4 times that of the first column 220 of stages 222–228. In an alternate embodiment of the invention a single clock could be used to drive the system with divide-by or clock-doubler circuitry providing the necessary frequency offsets for the individual stages of each of the columns.

The first column 220 is coupled to the second column 260 via mux 250. This mux allows any of the individual residues provided by column 220 to be processed by any one of the individual stages within the second column 260. Simiarly, column 260 is coupled to the final column/stage 278 by multiplexer 274. In alternate embodiments other switching arrangements may be implemented. It need not be the case that each stage of adjacent multiplexed columns be switchably connected to any one of the stages of the adjacent column. Instead, in an embodiment of the invention, multiplexing may be implemented by a switching arrangement incorporating one or more double pole single throw switches (DTSP) for example. In FIG. 2A a pair of double throw single pole (DPST) switches could be utilized to couple stage 264 to either of stages 226–228 and stage 262 to either of stages 222–224.

Figure 4A:
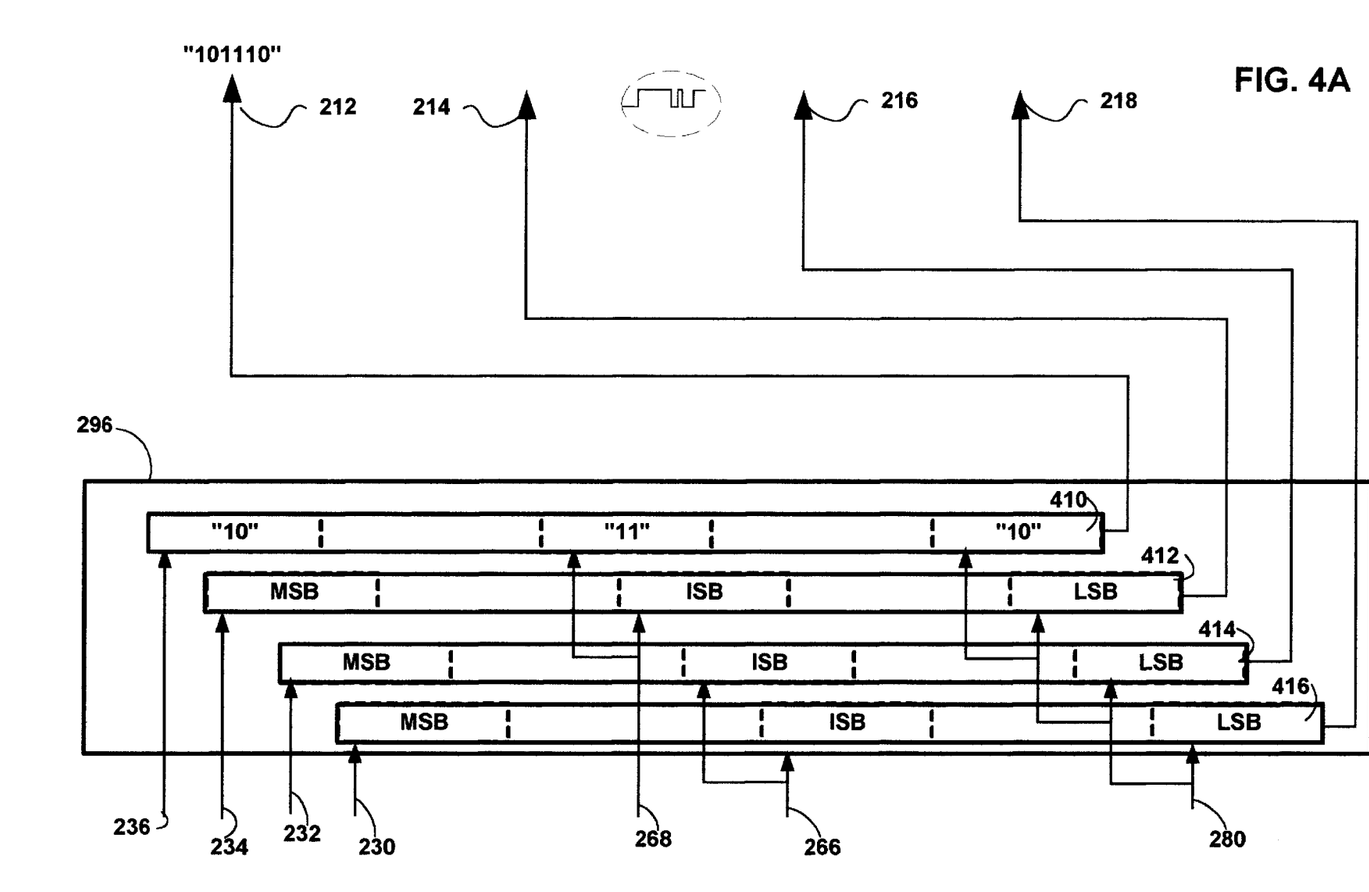
FIGS. 4A–B are hardware block diagrams showing an embodiment of a digital synchronization unit and a digital error correction unit suitable for coupling to the MPMC A/D converter of the current inventions.
Figure 4B:
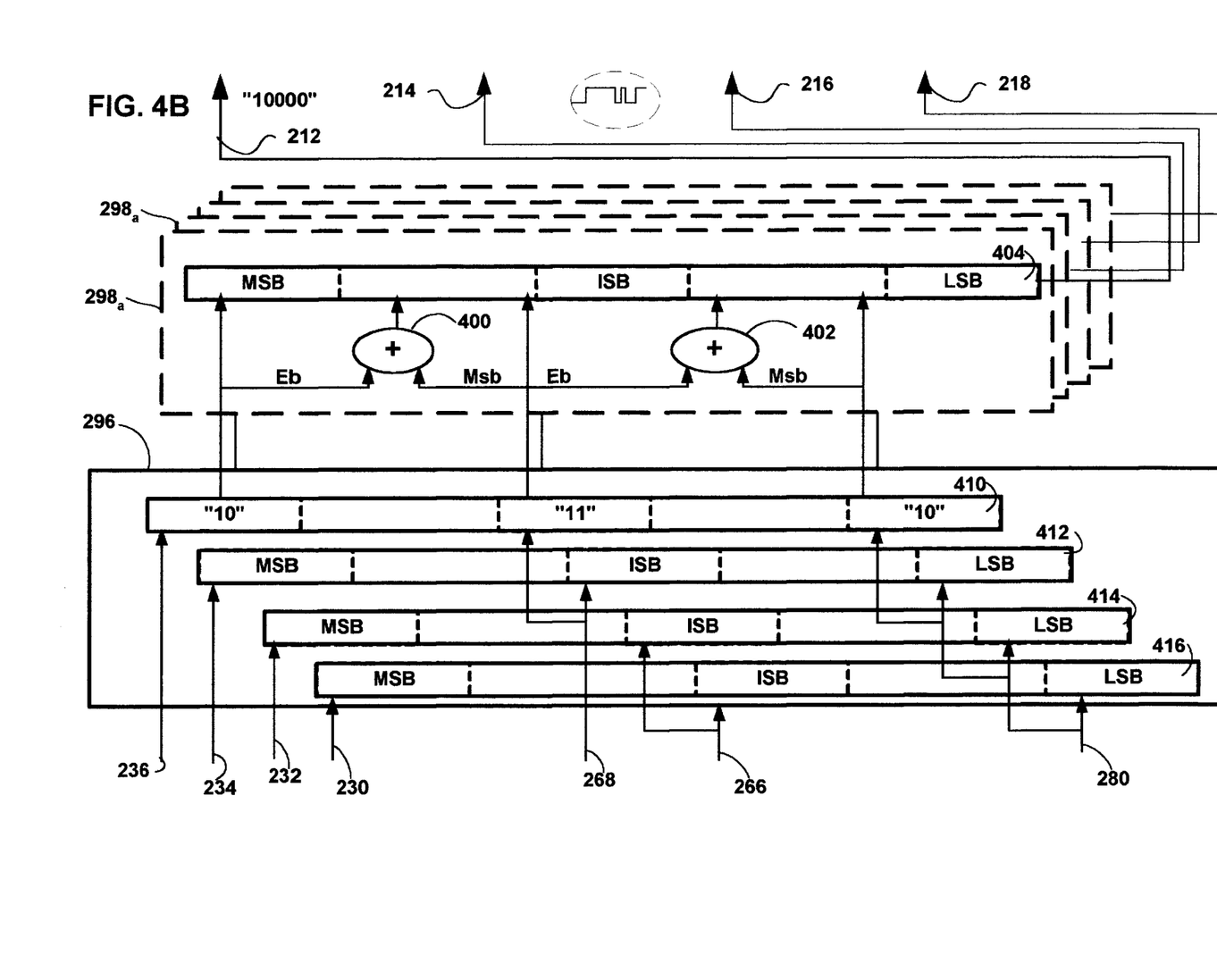

Each of the columns in FIG. 2B provides its outputs to digital synchronization unit 296 (See FIGS. 4A–B). This unit combines the most, intermediate, and least significant bit(s) for each channel into an overall digital signal for each channel during each sample interval. This output may be provided in serial or parallel form on one or more signal lines. In the example shown, the outputs of each channel are provided on discrete signal lines 212–218. To further improve precision, the overall digital signal may be subject to further processing by a digital error correction unit 298 (See FIG. 4B).

Each of the clocks 284–288 associated with the first second and third columns are part of a control unit 282. The control unit includes a controller 290. The controller 290 may receive input over signal line 292 from an external control source (not shown). The controller may be coupled with all the components of the converter. Responsive to such an external control signal, the controller may establish the switching architecture, clock frequency, digital synchronization, and error correction on the fly, and as appropriate for varying numbers and relative baud rates of input channels. The MPMC A/D converter is therefore equally capable of handling multiple channels, each with distinctive rate/symbol intervals, as it is handling multiple channels with identical baud rates.

Figure 3A:
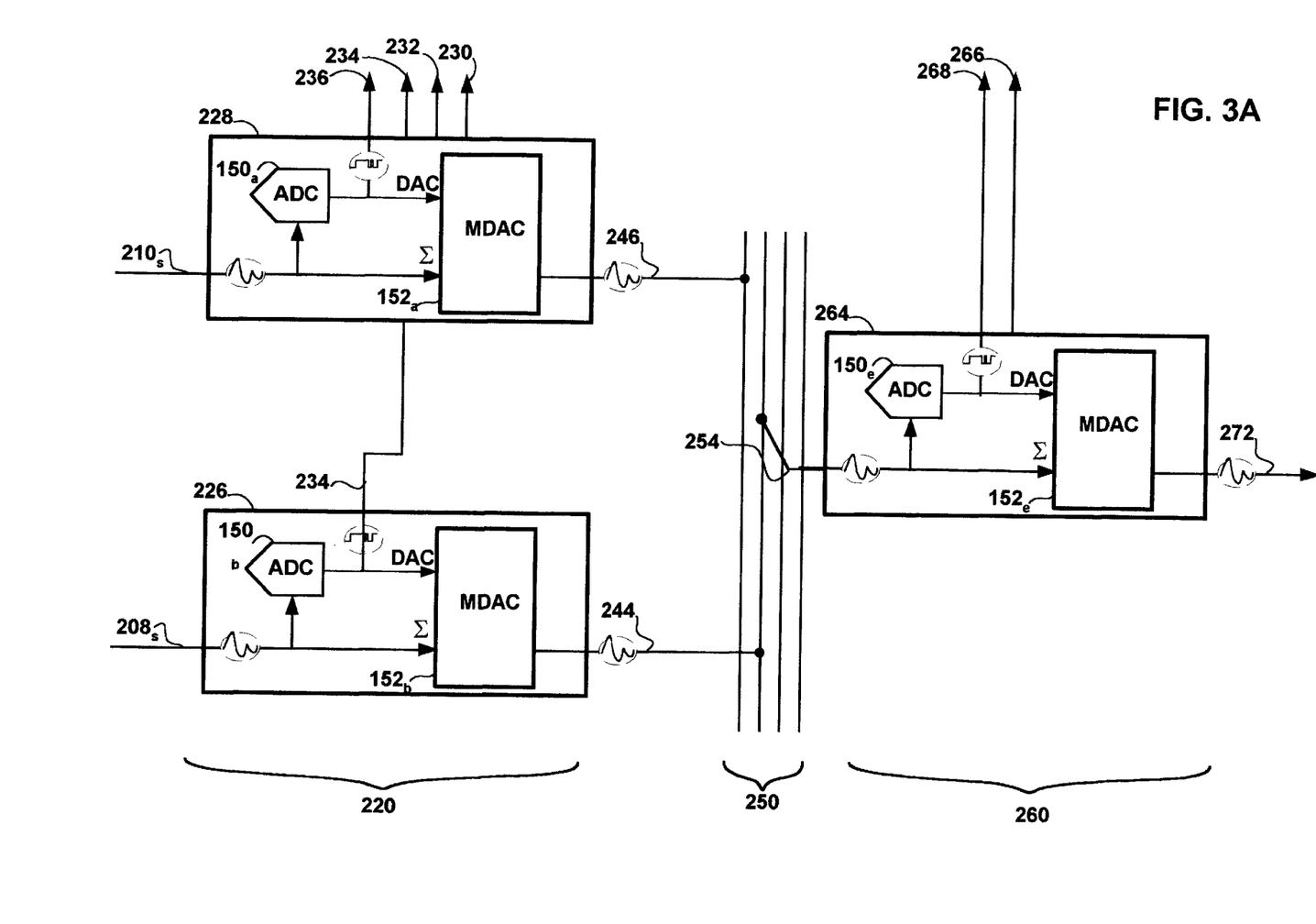
FIGS. 3A–B are hardware block diagrams showing alternate embodiments of the elements associated with neighboring stages in the MPMC A/D converter, according to the current invention.
Figure 3B:
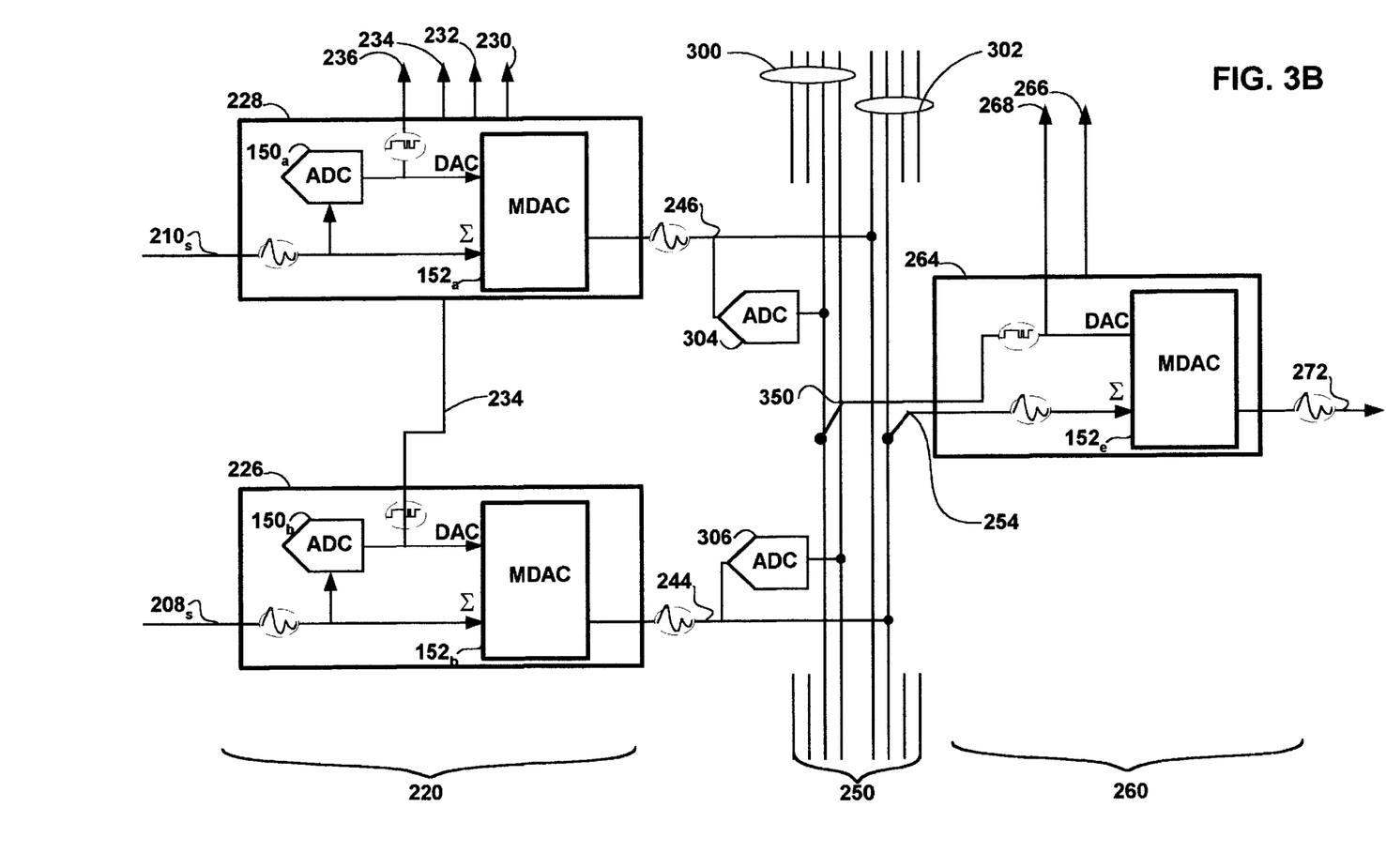

FIGS. 3A–B are detailed diagrams of alternate embodiments of an interface between columns to multiplex an upstream column with a downstream column (See FIG. 2A). A/D stages 226–228 in the first column 220 and A/D stage 264 in the second column 260 are shown. In this embodiment, each stage includes a corresponding ADC 150 as well as an MDAC 152, with the subscript identifying the corresponding stage. In the embodiment shown, the input to stage 226–228 is provided by signal lines 208–210, respectively. The residue from stages 226–228 is provided on signal lines 244–246, respectively. The residue signal lines 244–246 are coupled to a corresponding one among the traces of the multiplexer 250. Switch 254 couples stage 264 with appropriate ones of the traces of the multiplexer. The binary output from stage 264 is provided on bit line 268 with the amplified residue provided on residue signal line 272. In the embodiment shown in FIG. 3A, the ADC units of each stage are clocked at frequencies associated with each column. In the example shown, stage 264 would be clocked at two times greater the frequency of stages 226–228.

In FIG. 3B, an alternate embodiment of the invention is shown in which a single ADC 150e associated with stage 264 is moved upstream of the multiplexer 250 and is implemented as two discrete ADCs 304–306, associated with residue lines 246–244 of stages 228–226, respectively. Since digital sampling for the second column 260 is handled upstream of the interface, an additional set of digital traces 300 is added to the mux 250. These digital traces are switchably coupled to the input of the DAC which is part of the MDAC. Digital switch 350 handles this task. This architecture has the advantage of providing more time for the A/D conversion associated with column 260. This may improve the overall accuracy and precision of the system with only a slight increase in the complexity of the overall system.

In addition to the variations on the boundaries of each stage set forth in FIGS. 3A–B, alternate implementations in keeping with the claimed scope of the invention are envisaged. In an embodiment of the invention, the sample and hold portion of the MDAC may be moved to the input side of the neighboring downstream column providing sampled input thereto.

Although in each of the above-discussed embodiments each interface between columns has been implemented with multiplexing capability, this need not be the case. The present invention may be implemented with dedicated coupling of equal numbers of stages of adjacent upstream and downstream columns with a multiplexer introduced only between columns with an asymmetric number of stages.

FIG. 4A is a detailed hardware block diagram of an embodiment of the digital synchronization unit 296 (See FIG. 2B). FIG. 4B is a detailed hardware block diagram showing an embodiment of the digital synchronization unit 296 coupled to a digital error correction unit 298 (See FIG. 2B).

The digital synchronization unit 296 may be implemented with a plurality of buffers 410–416 associated with each of the incoming channels, e.g., channels 1–4. The buffer generally serves to remove the phase and timing differences between the multiple bit(s) lines delivered by each column to produce an overall binary sample of each channel during each sample interval. Thus, each buffer contains portions for the most significant bit(s) (MSB), intermediate significant bit(s) (ISB) and the least significant bit(s) (LSB). Where a single stage provides more than one channel of output, the buffers are, in turn, switchably connected to the stage so that each binary sample remains associated with the proper channel. As the digitization of an incoming analog sample is completed in any one buffer, the output of that buffer may be provided on corresponding one of signal lines 212–218 for further processing. The output may be serial or parallel. In alternate embodiments of the invention a single signal line may be used for output from the digital synchronization unit with each channel multiplexed thereon. The digital synchronization unit may be alternately implemented through a series of delay lies, FIFO/LIFO buffers or as discrete packets.

In FIG. 4B an embodiment of an A/D converter with both a digital synchronization unit and a digital error correction unit is shown. The digital error correction unit may be required to discriminate the effects of A/D stage non-linerity and inter-stage offset by providing redundancy in which the sum of the individual stage resolutions is greater than the total resolution. Such digital error corrections units are well known to those skilled in the art. A particular design for such a unit is set forth in a publication entitled: "A 10-B 20-M sample/S Analog-to-Digital Converter", published by IEEE Journal of Solid-State Circuits, Vol. 27, No. 3., March 1992 and authored by S. H. Lewis et al., at pages 351–358. This article is incorporated by reference as if fully set forth herein. The digital error correction unit may be implemented with summers 400–402 to handle the most and least significant bit(s) for each channel as provided by each column. In this embodiment the summer 400 adds the upper bit of the ISB with the lower bit of the MSB. Sumner 402 provides a similar function for the lower bit of the ISB and the upper bit of the LSB. Other summers perform similar functions for each of the channels. Thus, for example, where the overall binary sample for a channel during a sample interval equals binary "10-11-10", the output after passing through the error correction unit would be binary "10000". The error correction unit reduces the precision of the output while improving the accuracy. Alternate implementations of the error correction unit as well as a more detailed discussion of the theoretical underpinnings therefore are set forth in the above-mentioned article.

Figure 5A:
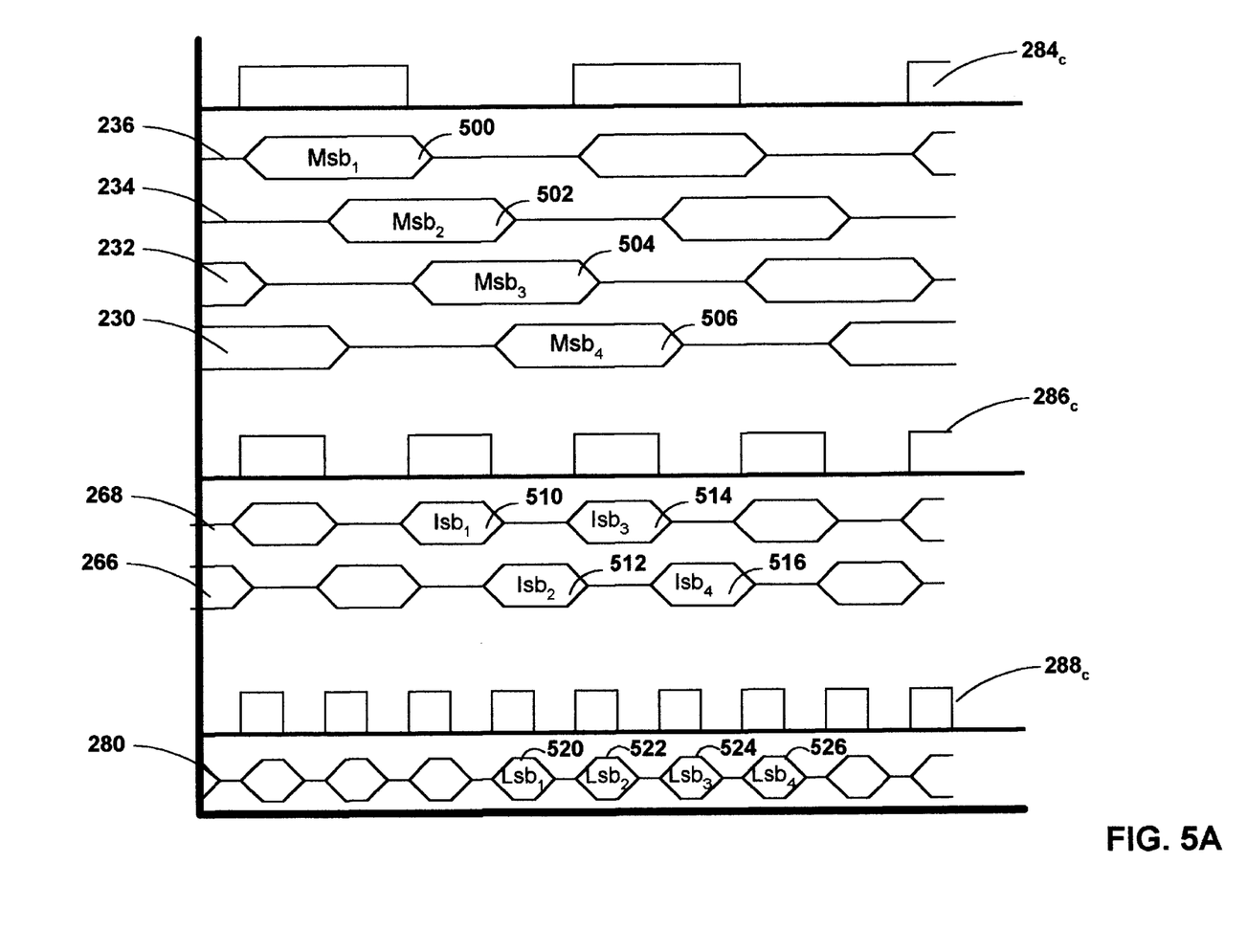
Figure 5B:
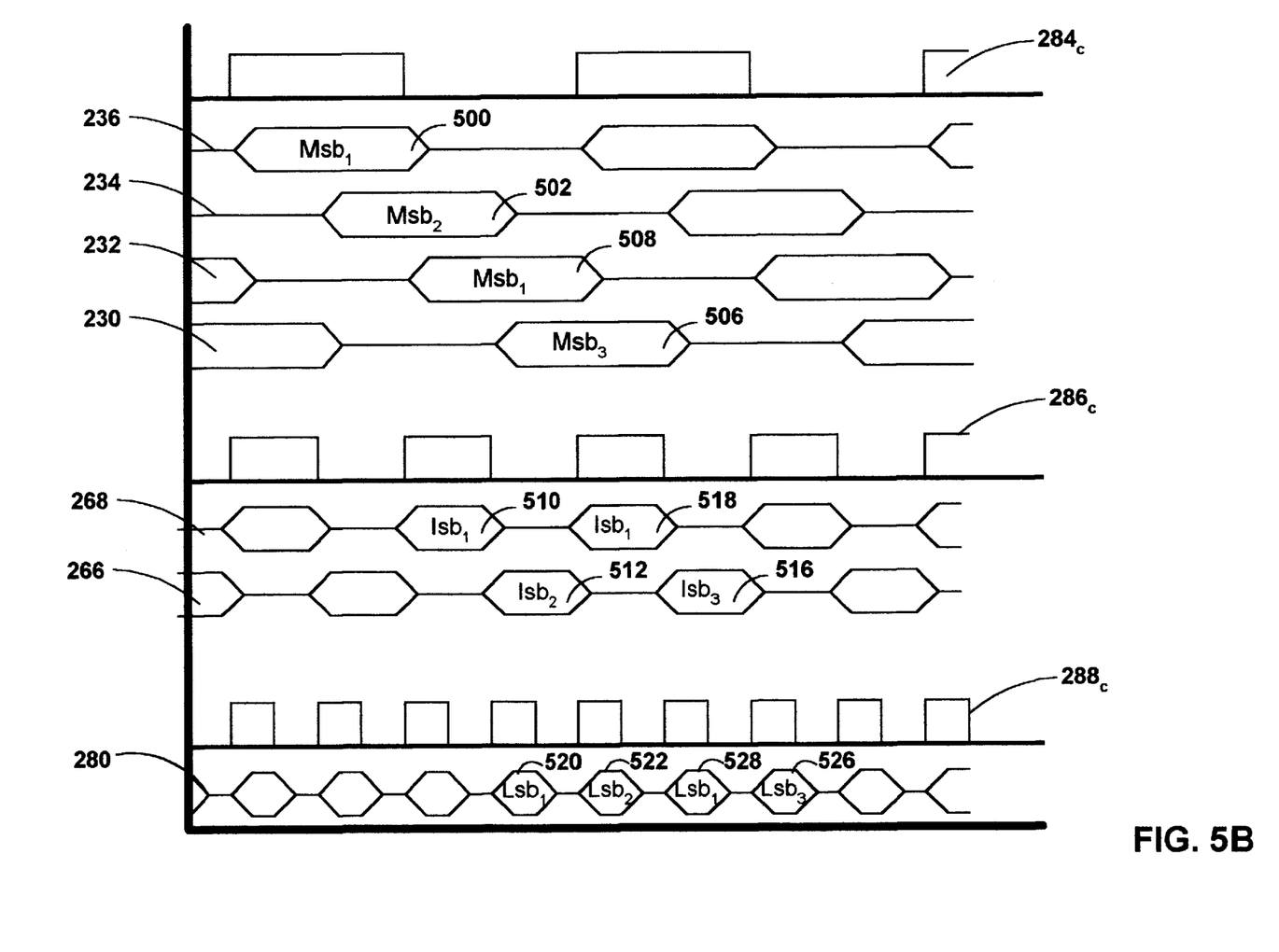

FIGS. 5A–B are timing diagrams for, respectively, the individual stages of each of the columns shown in FIGS. 2A referenced against the corresponding clocks 284–288 shown in FIG. 2B. In the embodiment shown, the clocking 284c of the first column occurs at a frequency that is half that of the clocking 286c of the second column 250, which is in turn half the frequency of the clocking 288cassociated with the third and final column/stage 278. The time required to obtain any complete sample is at least the sum of the time required for the residues to be passed through each of the successive columns. Processing of any given channel is sequential. In the example shown, the sampling is staggered between columns and between stages within a column. In the example shown, the most significant bits 500 of channel 1 are provided on the output line 236 of stage 228. These are followed in staggered fashion by the most significant bits of channels 2, 3, and 4 in packets 502–506 on bit(s) lines 234, 232, 230, respectively. The residues from each of these first column stages is made available in multiplexed fashion to the individual stages of the downstream column 260. Column 260 runs at a clock 286c with a frequency twice that of the first column. Thus, in the sampling interval of a stage in column 220, each stage in column 260 samples at least two discrete channels. The first sample 510 provided by column 260 comes from bit(s) line 268 and corresponds with the ISBs of channel 1. The next sample 514 produced by this stage corresponds with the ISBs of channel 3. Similarly, stage 262 also associated with the second column provides binary data packets 512, 516 for, respectively, the ISBs of channel 2 and 4. In this embodiment, the third and final sampling is performed by the third column 278, which, in this instance, is the single stage 278. The clock 288c for this stage runs at four times the frequency of the clock 284 associated with the first stage. Thus this stage outputs four binary data packets 520–526 for channels 1–4, respectively, during the interval required for all four stages in the first column to complete a single sample. Alternate timing arrangements may be implemented without departing from the scope of the invention, provided only that at least one of the downstream columns implements digital conversion by means of multiplexing of individual input channels through at least one stage of the downstream column.

FIG. 5B illustrates an embodiment of the invention in which the baud rate of channels may vary. To meet this variation in the inputs, the controller reconfigures the system to allocate more resources to the channel(s) with the relatively higher baud rate. The embodiment shown in FIG. 5B may be implemented by the MDAC shown in FIG. 2B. In the example shown in FIG. 5B, there are three channels at the input with the first channel having a symbol/baud rate twice that of the second and third channels. Multiplexer 294 allocates channel 1 more bandwidth from the first column 220. Downstream multiplexers 250 and 274 perform a similar function. Thus, during the overall sample interval for all the stages of column 220, channel 1 is sampled twice, once by stage 228 to produce binary sample 500 on bit line 236 and once by stage 224 to produce binary sample 508 on line 232. Stage 226 generates a single sample 502 of channel 2 on bit line 234. Stage 222 generates a single sample 506 of channel 3 on bit line 230. Within the downstream column 260, the residues from the upstream column 220 would also be asymmetrically processed. In the column 260, stage 264 produces binary samples 510,518 for channel 1 on bit line 268. Stage 262 generates a binary sample 512 of channel 2 and a binary sample 516 of channel 3 on bit line 266.

The residues from column 260 for each of the three channels are multiplexed across stage 278 of the third and final column. This stage generates binary samples 520, 528 for channel 1; binary sample 522 for channel 2; and binary sample 526 for channel 3 on line 280 during the time interval required for the four stages of column 220 to obtain a single sample.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. An A/D converter for obtaining digital samples from a plurality of analog information signals, and the A/D converter comprising:

a plurality of stages each including an input, a first output, and a second output, and each of the plurality of stages responsive to an input signal applied to the input to output at the first output a bit signal corresponding to at least one significant bit of the input signal and to output at the second output a residue signal corresponding to a difference between the input signal and the bit signal; and the plurality of stages arranged in columns;

interfaces between adjacent columns for passing residue signals from an upstream one of the adjacent columns to the inputs of a downstream one of the adjacent columns; and at least one interface including:

a multiplexer switchably coupling residue signals from at least two of the plurality of stages within the upstream one of the adjacent columns across one of the plurality of stages within the downstream one of the adjacent columns.

2. The A/D converter of claim 1, wherein the downstream one of the adjacent columns coupled with the multiplexer includes relatively fewer in number of the plurality of stages than the upstream one of the adjacent columns coupled with the multiplexer.

3. The A/D converter of claim 1, wherein each of the plurality of stages within the downstream one of the adjacent columns coupled with the multiplexer exhibits a relatively faster processing rate than each of the plurality of stages in the upstream one of the adjacent columns coupled with the multiplexer.

4. The A/D converter of claim 1, wherein each of the interfaces includes a multiplexer.

5. The A/D converter of claim 1, further comprising:
a multiplexer switchably coupling at least two of the plurality of analog information signals to a selected one of the plurality of stages within a first of the columns.

6. The A/D converter of claim 1, wherein each of the plurality of stages outputs at the second output a residue signal corresponding with an amplified difference between the input signal and the bit signal.

7. The A/D converter of claim 1, further comprising:
a digital synchronization unit coupled to each of the first outputs of each of the plurality of stages and the digital synchronization unit correlating each of the bit signals from each of the columns into overall bit signals and each overall bit signal corresponding with a digital representation of a corresponding one of the plurality of analog information signals.

8. The A/D converter of claim 7, further comprising:
a digital error correction unit coupled to the digital synchronization unit to modify the overall bit signals to correct for errors and to output corrected overall bit signals each corresponding with an error corrected digital representation of a corresponding one of the plurality of analog information signals.

9. An A/D converter for obtaining digital samples from a plurality of analog information signals, and the A/D converter comprising:
stages arranged as an upstream column and a downstream column and each of the stages including an input, a first output, and a second output, and each of the stages responsive to an input signal applied to the input to output at the first output a bit signal corresponding to at least one significant bit of the input signal and to output at the second output a residue signal corresponding to a difference between the input signal and the bit signal;
a multiplexer switchably coupling residue signals from at least two of the stages within the upstream column across one of the stages within the downstream column.

10. The A/D converter of claim 9, wherein the downstream column includes relatively fewer in number of the stages than the upstream column.

11. The A/D converter of claim 9, wherein each of the stages within the downstream column exhibits a relatively faster processing rate than each of the stages in the upstream column.

12. The A/D converter of claim 9, wherein each of the stages outputs at the second output the residue signal corresponding with an amplified difference between the input signal and the bit signal.

13. The A/D converter of claim 9, further comprising:
a digital synchronization unit coupled to each of the first outputs of each of the stages and the digital synchronization unit correlating each of the bit signals from the upstream and downstream column into overall bit signals and each overall bit signal corresponding with a digital representation of a corresponding one of the plurality of analog information signals.

14. The A/D converter of claim 13, further comprising:
a digital error correction unit coupled to the digital synchronization unit to modify the overall bit signals to correct for errors and to output corrected overall bit signals each corresponding with an error corrected digital representation of a corresponding one of the plurality of analog information signals.

15. A method for obtaining digital samples from a plurality of analog information signals, and the method for converting comprising the acts of:
obtaining during a first time interval;
a) a first magnitude of a first of the plurality of analog information signals and a second magnitude of a second of the plurality of analog information signals; and
b) differencing the first magnitude with the first of the plurality of analog information signals to generate a first residue, and differencing the second magnitude with the second of the plurality of analog information signals to generate a second residue; and
obtaining during a second time interval beneath a selected threshold no greater than ½ the first time interval:
c) the magnitude of the first residue and the magnitude of the second residue;and
combining the first magnitude with the magnitude of the first residue to extend a precision of the first magnitude and combining the second magnitude with the magnitude of the second residue to extend the precision of the second magnitude.

16. A method for obtaining digital samples from analog information signals, and the method for converting comprising the acts of:
obtaining during a first time interval for signals corresponding with each of the analog information signals both a first magnitude, and a first residue and the residue obtained by differencing each of the first magnitudes with a corresponding one of the analog information signals;
obtaining during a second time interval beneath a selected threshold no greater than ½ the first time interval both a second magnitude and a second residue for each of the first residues, and the second residues obtained by differencing each of the second magnitudes with a corresponding one of the first residues; and
combining each of the first magnitudes together with a corresponding one of the second magnitudes to extend a precision of each of the first magnitudes.

* * * * *